United States Patent [19]

Oakland et al.

[11] Patent Number: 4,868,413
[45] Date of Patent: Sep. 19, 1989

[54] TESTABLE PASSGATE LOGIC CIRCUITS

[75] Inventors: Steven F. Oakland, Colchester; Clarence R. Ogilvie, Huntington, both of Vt.

[73] Assignee: International Business Machines Corporation, Armonk, N.Y.

[21] Appl. No.: 183,865

[22] Filed: Apr. 20, 1988

[51] Int. Cl.$^4$ .................. H03K 17/56; H03K 17/687
[52] U.S. Cl. .................................. 307/243; 307/572; 328/104; 328/137; 328/154
[58] Field of Search .............. 307/443, 242, 243, 572; 328/104, 137, 154

[56] References Cited

U.S. PATENT DOCUMENTS

| | | | |
|---|---|---|---|
| 3,397,325 | 8/1968 | Weimer | 307/251 |
| 4,280,212 | 7/1981 | Ransom et al. | 307/243 |
| 4,356,413 | 10/1982 | Rosenbluth et al. | 307/243 |
| 4,524,443 | 6/1985 | Crocker et al. | 307/243 |
| 4,551,634 | 11/1985 | Takahashi et al. | 307/243 |
| 4,567,385 | 1/1986 | Falater et al. | 307/243 |

OTHER PUBLICATIONS

IBM TDB Zero Power and Gate by W. R. Kraft et al., vol. 23, No. 10, Mar. 1981, pp. 4394-4395.

Primary Examiner—Stanley D. Miller
Assistant Examiner—Richard Roseen
Attorney, Agent, or Firm—Stephen J. Limanek

[57] ABSTRACT

A logic circuit is provided which includes a multiplexer having a plurality of parallelly arranged channels, each channel including a switching device having a control element and responsive to a first control signal, a plurality of signal terminals, a common terminal, each of the channels being connected between a respective one of the plurality of signal terminals and the common terminal, and a termination circuit which includes a series circuit having a plurality of switching devices, each having a control element and being responsive to a second control signal. The control elements of each of the plurality of switching devices of the series circuit are coupled to a respective one of the control elements of the switching devices of the channels so that when one of the switching devices of the series circuit is turned on, the respective one of the switching devices of the channels is turned off, and vice versa.

22 Claims, 1 Drawing Sheet

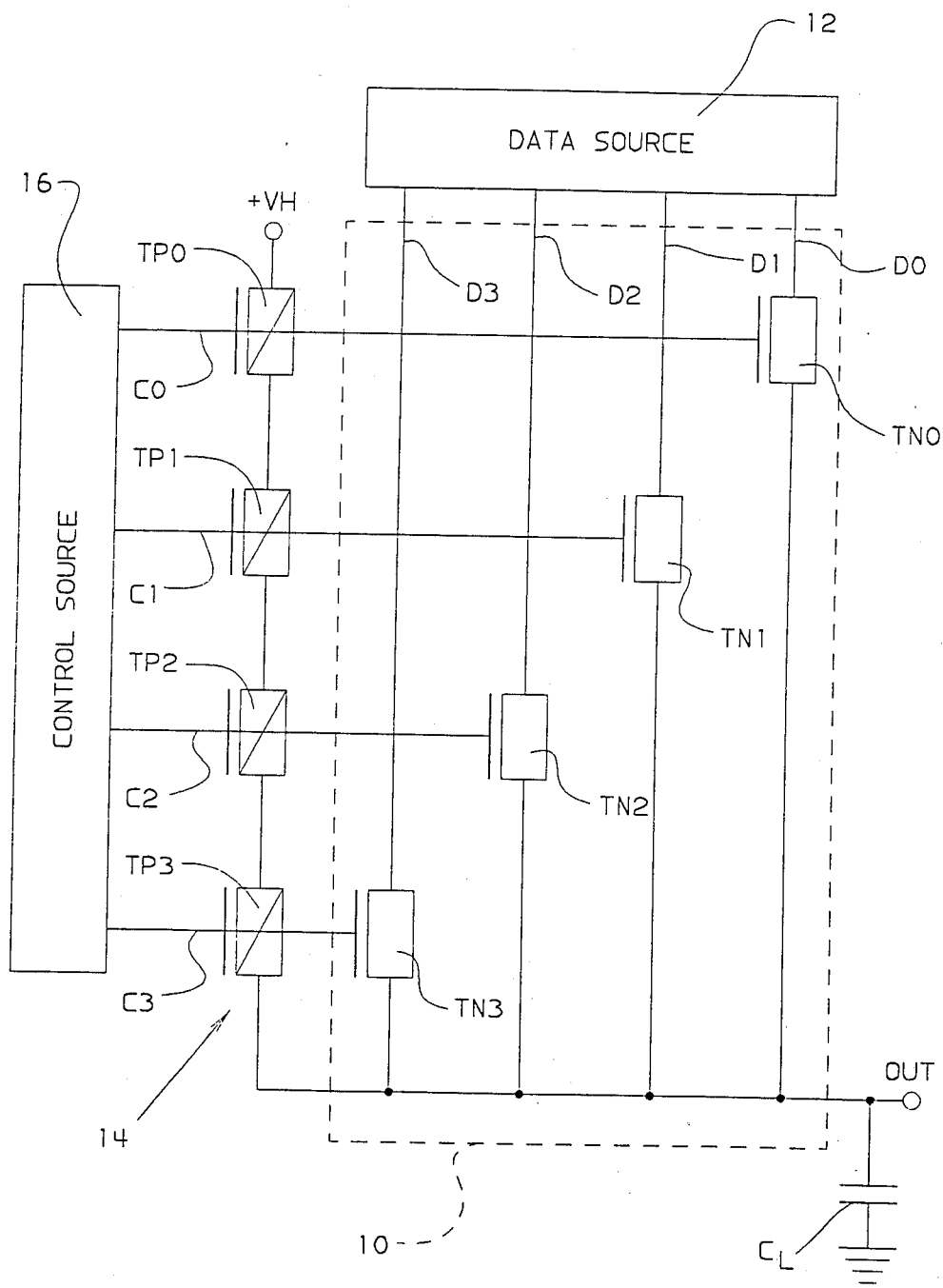

TESTABLE PASSGATE LOGIC CIRCUITS

DESCRIPTION

1. Technical Field

This invention relates to integrated semiconductor switching circuits and, more particularly, to logic switching circuits of the multiplexer-type wherein the multiplexer as well as the circuitry controlling the multiplexer can be readily tested.

2. Background Art

Switching circuits of the multiplexer-type are well known; however, techniques for satisfactorily testing multiplexers and the circuits used for controlling the multiplexers have not been available. Multiplexers using passgates have been tested by applying pulses or signals derived from control logic, such as decoders, to the control elements of the passgates. If the control logic is faulty, a multiplexer may pass a test when it should fail. More specifically, when a logic circuit driving a control element of a passgate is stuck inactive, i.e., always applies only 0 or low level pulses to the control element of the passgate, the output of the multiplexer holds the charge from its previous state. The output of the multiplexer may or may not be previously charged to the currently expected level. Consequently, the test may pass when it should fail. If the logic circuit driving the control element of the passgate is, on the other hand, stuck active, i.e., always applies only 1 or high level pulses, the output of the multiplexer is controlled by the particular data input signal passing through the passgate to the output of the multiplexer. With all control elements of the passgates de-selected, i.e., with 0 or low level pulses applied to the control elements of all the passgates, the output of the multiplexer is expected to be in the high impedance state. The data controlling the multiplexer output may or may not be the same as that expected at the output. Consequently, the test may pass when it should fail.

Known solutions to this problem include the use of a termination device or circuit connected to the output of the multiplexer for discharging the charge accumulated at the output of the multiplexer, and more specifically across the parasitic load capacitor connected to the output of the multiplexer.

In IBM Technical Disclosure Bulletin Vol. 23 No. 10 March, 1981, pp. 4394–4395, there is disclosed a circuit for multiplexing multiple signals into a register or load having a depletion device as a bleeder path between the output and ground so as to eliminate intermediate states. Such a depletion device normally has an attendant long time constant unless it is made is a very large device. Unfortunately, when the depletion device is made to a large size, large input signals are required to supply additional resistive current. Such a circuit has undesirable characteristics for present day high speed logic circuit requirements.

U.S. Pat. No. 4,551,634, filed on Mar. 30, 1983, by H. Takahashi et al, discloses a multiplexing input circuit which also has a bleeder path connected to its output. In this circuit the bleeder path includes a device which is controlled by a clock pulse. The clock pulse turns off the device when a signal is to pass through the circuit. Such a circuit may be satisfactory when the necessary clock pulse is available and when the desired quiescent state is ground.

In U.S. Pat. No. 3,397,325, filed on Dec. 30, 1968, P. K. Weimer, there is disclosed a multiplexer-type circuit wherein the common out is connected to ground by a resistor with N channel transistors used as passgates and P channel transistors connected in parallel used to apply a voltage bias to sensing elements. The N channel and P channel transistors are paired so that the control elements or electrodes of each pair are commonly connected.

DISCLOSURE OF THE INVENTION

It is an object of this invention to provide improved logic circuits of the multiplexer-type wherein both the multiplexer and circuitry for controlling the multiplexer can be readily tested.

In accordance with the teachings of this invention, a logic circuit is provided which includes a switching network, such as a multiplexer, having a plurality of parallelly arranged channels, each channel including a switching device having a control element and responsive to a first control signal, a plurality of signal terminals, a common terminal, each of the channels being connected between a respective one of the plurality of signal terminals and the common terminal, and a termination circuit which includes a series circuit having a plurality of switching devices each having a control element and being responsive to a second control signal. The control elements of each of the plurality of switching devices of the series circuit are coupled to a respective one of the control elements of the switching devices of the channels so that when one of the switching devices of the series circuit is turned on, the respective one of the switching devices of the channels is turned off, and vice versa. In a preferred embodiment of the present invention, the switching devices of the channels are N channel field effect transistors the switching devices of the termination circuit are P channel field effect transistors, with each of the control elements of the switching devices of the series circuit being directly connected to the control element of its respective switching device of the channels, and the common terminal is connected to a capacitive load.

The foregoing and other objects, features and advantages of the invention will be apparent from the following more particular description of the preferred embodiments of the invention, as illustrated in the accompanying drawing.

BRIEF DESCRIPTION OF THE DRAWING

The FIGURE is a circuit diagram of a preferred embodiment of the logic circuit of the present invention illustrating a multiplexer and a termination circuit having serially arranged transistors.

BEST MODE FOR CARRYING OUT THE INVENTION

Referring to the FIGURE of the drawing in more detail, there is shown a circuit diagram of a preferred embodiment of the testable passgate logic circuit of the present invention. The circuit is made in complementary metal oxide semiconductor (CMOS) technology with P channel field effect transistors indicated in the drawing by a rectangle with a diagonal line formed therein and a control element or gate electrode arranged adjacent thereto and with N channel field effect transistors indicated by a rectangle without a diagonal line and a control element or gate electrode arranged adjacent thereto.

The testable CMOS passgate logic circuit of the present invention illustrated in the FIGURE of the drawing includes a switching network 10 having a plurality of data channels D0, D1, D2 and D3 connected from a plurality of data terminals of a data source 12 to a common output terminal OUT. The signals from the data source 12 may represent any desired information, preferably in binary coded form so that, e.g., a low voltage level, such as 0 volts, represents a 0 binary digit and a high voltage level, such as +5 volts, represents a 1 binary digit of information. Each of the data channels D0, D1, D2 and D3 includes a switching device, preferably an N channel field effect transistor, TN0, TN1, TN2 and TN3, respectively. The common output terminal OUT is coupled to ground through a load capacitor $C_L$ which is primarily a parasitic capacitor.

The common output terminal OUT is also connected to a positive voltage source +VH, which may be at a voltage of about +5 volts or less, through a termination circuit 14 having serially connected P channel field effect transistors TP0, TP1, TP2 and TP3. A control source 16 provides control signals to a plurality of control lines C0, C1, C2 and C3. The control signals have a high voltage of, say, +3 to +5 volts sufficient to selectively turn on the N channel transistors TN0, TN1, TN2 and TN3 of the switching network 10 and a low voltage of, say, 0 volts to selectively turn on the P channel transistors of the termination circuit 14. The control line C0 is connected to the gate electrodes of the P channel transistor TP0 and of the N channel transistor TN0, the control line C1 is connected to the gate electrodes of the P channel transistor TP1 and of the N channel transistor TN1, the control line C2 is connected to the gate electrodes of the P channel transistor TP2 and of the N channel transistor TN2 and the control line C3 is connected to the gate electrodes of the P channel transistor TP3 and of the N channel transistor TN3. The control source 16 may typically derive control signals applied to the lines C0, C1, C2 and C3 from any known decoder and the data source 12 may typically derive data signals applied to the channels D0, D1, D2 and D3 from any known arithmetic logic unit (ALU), memory or plurality of latches.

In the operation of the circuit of the FIGURE of the drawing, during normal functioning of the logic circuit as a multiplexer, one of the control lines such as C0 is selected by applying a 1 control signal thereto from the control source 16 to turn on the N channel transistor TN0 which passes a data signal from data source 12 through channel D0 to the load capacitor $C_L$. It can be seen that during such normal operation of the multiplexer the output terminal OUT is isolated from the positive voltage source +VH since the 1 control signal is also applied to the gate electrode of the P channel transistor TP0 which renders this P channel transistor inoperative to effectively disconnect the termination circuit 14 from the output terminal OUT. It should also be noted that if any other data channel D1, D2 or D3 is selected, the termination circuit 14 is effectively disconnected from the output terminal OUT, i.e., if data channel D1 is selected, N channel transistor TN1 is turned on and P channel transistor TP1 is turned off, if data channel D2 is selected, N channel transistor TN2 is turned on and P channel transistor TP2 is turned off and, if data channel D3 is selected, N channel transistor TN3 is turned on and P channel transistor TP3 is turned off. Thus, it can be seen that even though the termination circuit 14 has been provided for test purposes, its presence in the logic circuit does not interfere with the normal operation of the switching network or multiplexer 10.

In order to test the logic circuit, including the multiplexer 10, the control lines C0, C1, C2 and C3 and the circuits within the control source 16, as shown in the FIGURE of the drawing, any desired pattern of pulses may be applied to the control lines C0, C1, C2 and C3 and to the data channels D0, D1, D2 and D3.

First consider the testing of the multiplexer 10 without the use of the termination circuit 14, i.e., as tested in the prior art. If a circuit in the control source 16 driving a selected control line, e.g., control line C0, is stuck inactive, i.e., always provides only a 0 control signal to line C0, the output terminal OUT maintains the charge from its previous state since the N channel transistor TN0 has not been turned on to pass the data signal through data channel D0. The output terminal OUT may or may not have been previously charged to the currently expected level. If the control line C0 is stuck at the 0 signal level because of a fault and a 0 data signal is applied to the data channel D0, the voltage at the output terminal OUT remains at the previous state, e.g., the 0 signal level. Since the output of the faulty circuit is the same as the expected output, the fault is undetected. Consequently, the test may pass when it should fail. If the circuit in the control source 16 driving the control line C0 is, on the other hand, stuck active, i.e., always provides only a 1 control signal to line C0, the output terminal OUT is controlled by the corresponding data applied to the data channel D0 from the data source 12. With none of the control lines C0, C1, C2 and C3 selected, the multiplexer 10 is expected to be in the high impedance state. The data controlling the multiplexer output may or may nor be the same as that expected at the output terminal OUT. Consequently, the test may pass when it should fail. More specifically, if, e.g., none of the control lines C0, C1, C2 and C3 is selected and a 0 data signal is applied to the data channel D0, then the expected output is a 0 signal level. If control line C0 is stuck at control signal 1 because of a fault, the output is also at a 0 signal level. Since the output signal at the output terminal OUT of the faulty circuit is the same as the expected output signal, the fault is undetected.

When testing a logic circuit which includes the termination circuit 14 of the present invention, such failures do not go undetected. In the testing of the circuit of the FIGURE of the drawing in accordance with the teaching of this invention, if, e.g., each of the control lines C0, C1, C2 and C3 in the FIGURE of the drawing has a 0 control signal applied thereto, the output terminal OUT is driven to a 1 signal level instead of being in an indeterminate state since all of the P channel transistors TP0, TP1, TP2 and TP3 are turned on connecting the positive voltage source +VH to the output terminal OUT. This step removes all indeterminate states from the circuit that may be caused by inactive control inputs. More specifically, to test for a stuck inactive or stuck 0 control signal on, e.g., control line C0, a 1 control signal is applied to control line C0 and a 0 data signal is applied to data channel D0. If the control input to control line C0 is in fact stuck inactive, the voltage on the output terminal OUT is forced to a 1 signal level by the termination circuit 14, since the P channel transistor TP0 has been turned on along with the other P channel transistors, instead of being forced to a 0 signal level by the data input from the data source 12. Because the output voltage differs from the expected output voltage, the fault is detected. Similarly, to test for a stuck active or stuck 1 control signal on the control line C0, none of the control lines C0, C1, C2 and C3 is selected and a 0 signal is applied to the data channel D0. If the control input to control line C0 is in fact stuck active, the voltage on the output terminal is forced to a 0 signal level when it is expected to be forced to a 1 signal level by the termination circuit 14. Again, since the output voltage differs from the expected output voltage, the fault is detected. Of course, if the control source 16 and the termination circuit 14 are operating properly, any fault in the data source 12 or in the data channels D0, D1, D2, and D3 can be readily detected at the output terminal OUT.

Accordingly, it can be seen that a more readily testable logic circuit, particularly one that includes a multiplexer, has been provided by this invention which minimizes or eliminates intermediate or unknown states during the testing procedure. More specifically, this invention provides a CMOS passgate multiplexer which includes an output termination circuit having stacked or serially connected P channel field effect transistors. This termination circuit does not require any special test-only input/output connections as is required by the prior art circuits, nor are special control pulses required to turn on and turn off elements or circuits for test or normal operation purposes. Thus, the circuit is available for test purposes at any time. Furthermore, the circuit of this invention does not dissipate direct current or DC power, does not require large size devices or transistors and its utility extends beyond the testing technology to functional on-line error-detection/diagnostic uses. The output termination circuit of this invention uses only the transient power required to charge the load capacitor to the positive voltage source +VH, and this transient power is consumed only when none of the passgates or data channels D0, D1, D2 and D3 are selected. Additionally, it should be noted that the output termination circuits or elements of the multiplexers of the present invention formed on a given semiconductor chip need not be connected together or to separate or special semiconductor chip input terminals or pins, as has been done in the prior art testing circuits, since the output termination circuits of this invention are simply connected to the positive voltage source +VH and to the existing control elements of the multiplexer switching devices or transistors TN0, TN1, TN2 and TN3.

Although the circuit of the present invention has been illustrated in the drawing as being made in the CMOS technology, it should be understood that circuits in accordance with the teachings of the present invention may use other technologies such as an all N channel or NMOS technology by, e.g., using appropriate inverters between the control elements of the output termination circuit 14 and the control elements of the transistors of the multiplexer 10. Furthermore, although four data input ports or channels D0, D1, D2 and D3 have been illustrated in the FIGURE of the drawing, it should be understood that a different number of channels, e.g., 2, 6, 8, 10, 12, 14, or 16, may be used in the multiplexer 10 with a corresponding decrease or increase in the number of P channel devices used in the output termination circuit 14.

While the invention has been particularly shown and described with reference to preferred embodiments thereof, it will be understood by those skilled in the art that various changes in form and detail may be made therein without departing from the spirit and scope of the invention.

What is claimed is:

1. A logic circuit comprising
   a data source having first and second output terminals,
   a common output terminal,
   a switching network including a first channel having a first switching device and a second channel having a second switching device, each of said switching devices having a control element, said first channel being connected between the first output terminal of said data source and said common output terminal and said second channel being connected between the second output terminal of said data source and said common output terminal,
   a control source having first and second output terminals,
   an output termination circuit having third and fourth serially-arranged switching devices, each having a control element, connected between said common output terminal and a point of reference potential, and
   means coupling the first and second output terminals of said control source to the control elements of said first, second, third and fourth switching devices for simultaneously turning on said first switching device and turning off said third switching device and for simultaneously turning of said second switching device and turning on said fourth switching device.

2. A logic circuit as set forth in claim 1 wherein said first and second switching devices are N channel field effect transistors and said third and fourth switching devices are P channel field effect transistors and said means includes a direct connection from the first output terminal of said control source to the control elements of said first and third transistors and a direct connection from the second output terminal of said control source to the control elements of said second and fourth transistors.

3. A logic circuit as set forth in claim 2 further including a capacitive load connected to said common output terminal.

4. A logic circuit comprising
   a data source having a given plurality of output terminals,
   a common output terminal,
   a capacitor connected to said common output terminal,
   a multiplexer including a given plurality of data channels, each of said channels having a transistor, including a gate electrode, connected between a different one of said given plurality of output terminals of said data source and said common output terminal,
   a control source having a given plurality of output terminals,
   an output termination circuit having a given plurality of serially-arranged transistors, each of said serially-arranged transistors including a gate electrode, the gate electrodes of each of said given plurality of serially-arranged transistors being coupled to a respective one of the gate electrodes of said transistors of said multiplexer, and
   means coupling the given plurality of output terminals of said control source to respective gate electrodes of said serially-arranged transistors for selectively turning off each of the serially-arranged transistors and simultaneously turning on its respective one of said transistors of said multiplexer.

5. A logic circuit as set forth in claim 4 wherein each of said transistors is a field effect transistor.

6. A logic circuit as set forth in claim 5 wherein each of the transistors of said multiplexer is an N channel field effect transistor and each of the transistors of said termination circuit is a P channel field effect transistor.

7. A logic circuit as set forth in claim 6 wherein the gate electrodes of each of said given plurality of serially-arranged transistors are directly connect to a respective one of the gate electrodes of said transistors of said multiplexer and to a respective one of the output terminals of said control source.

8. A logic circuit comprising
a given plurality of data source terminals,
a common output terminal,
a given plurality of data channels, each channel being connected between a respective one of said given plurality of data source terminals and said common output terminal and each channel including a transistor having a control element,
a point of reference potential,
a given plurality of serially-arranged transistors, each having a control element, coupled between said common output terminal and said point of reference potential,
a given plurality of control source terminals, and
means coupling said given plurality of control source terminals to the control elements of said transistors for selectively turning off each of said serially-connected transistors and turning on a respective one of a said transistors of said given plurality of data channels.

9. A logic circuit as set forth in claim 8 wherein each of said transistors is a field effect transistor.

10. A logic circuit as set forth in claim 9 wherein each of the transistors of said given plurality of data channels is an N channel field effect transistor and each of the transistors of said given plurality of serially-connected transistors is a P channel transistor.

11. A logic circuit as set forth in claim 10 wherein said means includes direct electrical connections from said given plurality of control source terminals to the control elements of said transistors.

12. A logic circuit comprising
a data source having first and second output terminals,
a common output terminal,
a capacitor connected between said common output terminal and a point of reference potential,
a first transistor connected between the first output terminal of said data source and said common output terminal,
a second transistor connected between the second output terminal of said data source and said common output terminal,
a voltage source,
third and fourth transistors serially connected between said common output terminal and said voltage source, said first and second transistors being of a given conductivity type and said third and fourth transistors being of a conductivity type opposite to that of the given conductivity type, and
a control source having first and second output terminals, the first output terminal of said control source being connected to the control elements of said first and third transistors and the second output terminal of said control source being connected to the control elements of said second and fourth transistors.

13. A logic circuit as set forth in claim 12 wherein said transistors are field effect transistors.

14. A logic circuit as set forth in claim 13 wherein said first and second transistors of given conductivity type are N channel field effect transistors and said third and fourth transistors are P channel field effect transistors.

15. A circuit comprising
first and second transistors arranged in parallel and connected to a common terminal, said first and second transistors being of a given conductivity type and having control elements,
a series circuit including third and fourth transistors connected to the common terminal, said third and fourth transistors being of an opposite conductivity type to that of said given conductivity type and having control elements,
means for applying a first predetermined control pulse to the control elements of said first and third transistors and a second predetermined control pulse to the control elements of said second and fourth transistor, and
means for applying data signals through said first and second transistors to said common terminal.

16. A logic circuit as set forth in claim 15 wherein said first and second transistors are N channel field effect transistors and said third and fourth transistors are P channel field effect transistors.

17. A circuit comprising
a switching network having a plurality of parallelly-arranged channels, each channel including a switching device having a control element and being responsive to a first signal from a control source,
a plurality of signal terminals,
a common terminal, each of said channels being connected between a respective one of said plurality of signal terminals and said common terminal, and
a termination circuit including a series circuit having a plurality of switching devices, each having a control element and being responsive to a second signal from said control source, the control elements of each of said plurality of switching devices being coupled to a respective one of the control elements of the switching devices of said channels.

18. A circuit as set forth in claim 17 wherein the switching devices of said channels are N channel field effect transistors and the switching devices of said termination circuit are P channel field effect transistors.

19. A logic circuit as set forth in claim 1 wherein said means
couples the first and second output terminals of said control source to the control elements of said first, second, third and fourth switching devices for simultaneously turning on said first switching device and turning of said third switching device and for simultaneously turning off said second switching device and turning on said fourth switching device during a first period of time and
couples the first and second output terminals of said control source to the control elements of said first, second, third and fourth switching devices for simultaneously turning off said first switching device and turning on said third switching device and for simultaneously turning on said second switching device and turning off said fourth switching device during a second period of time.

20. A logic circuit as set forth in claim 4 wherein said means includes electrically conductive lines.

21. A circuit as set forth in claim 15 further including a point of reference potential, said series circuit being connected between said point of reference potential and said common terminal.

22. A circuit as set forth in claim 18 wherein said first signal has a voltage of a first magnitude and said second signal has a voltage of a second magnitude different from said first magnitude.

* * * * *